(12) United States Patent
Nakamura

(10) Patent No.: US 6,308,310 B1
(45) Date of Patent: Oct. 23, 2001

(54) SYSTEM FOR AVOIDING ELECTROMIGRATION IN LSI CIRCUITS

(75) Inventor: Kazushi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/004,329

(22) Filed: Jan. 8, 1998

(30) Foreign Application Priority Data

Jan. 8, 1997 (JP) .................................................. 9-000999

(51) Int. Cl.$^7$ .................................................. H03K 17/16
(52) U.S. Cl. .................................................. 716/14
(58) Field of Search .............................. 604/20; 307/443; 703/14

(56) References Cited

U.S. PATENT DOCUMENTS 5,317,207 * 5/1994 Mortensen ........................... 307/443
5,978,701 * 11/1999 Johnson .................................. 604/20

FOREIGN PATENT DOCUMENTS

| 2-188943 | 7/1990 | (JP) . |
| 4-242959 | 8/1992 | (JP) . |
| 4-365350 | 12/1992 | (JP) . |

OTHER PUBLICATIONS

Article—"Design for Reliability: The Major Challenge for VLSI", Ping Yang, Fellow, IEEE, and Jue–Hsien Chern, Member, IEEE (Proceedings of the IEEE, vol. 81, No. 5, May 1993).
Article—CAD for Logic Devices, Information Processing Society in Japan, Mar. 20, 1980, pp. 31–62.

* cited by examiner

Primary Examiner—Matthew Smith
Assistant Examiner—Thuan Do
(74) Attorney, Agent, or Firm—Foley & Lardner

(57) ABSTRACT

A system is provided which has proved to be advantageous in avoiding electromigration-induced failure problem. Electric current density along a path along which a condutor line lies is determined by calculation. When the determined electric current density is not less than a predetermined value, a buffer is automatically inserted into the path.

15 Claims, 9 Drawing Sheets

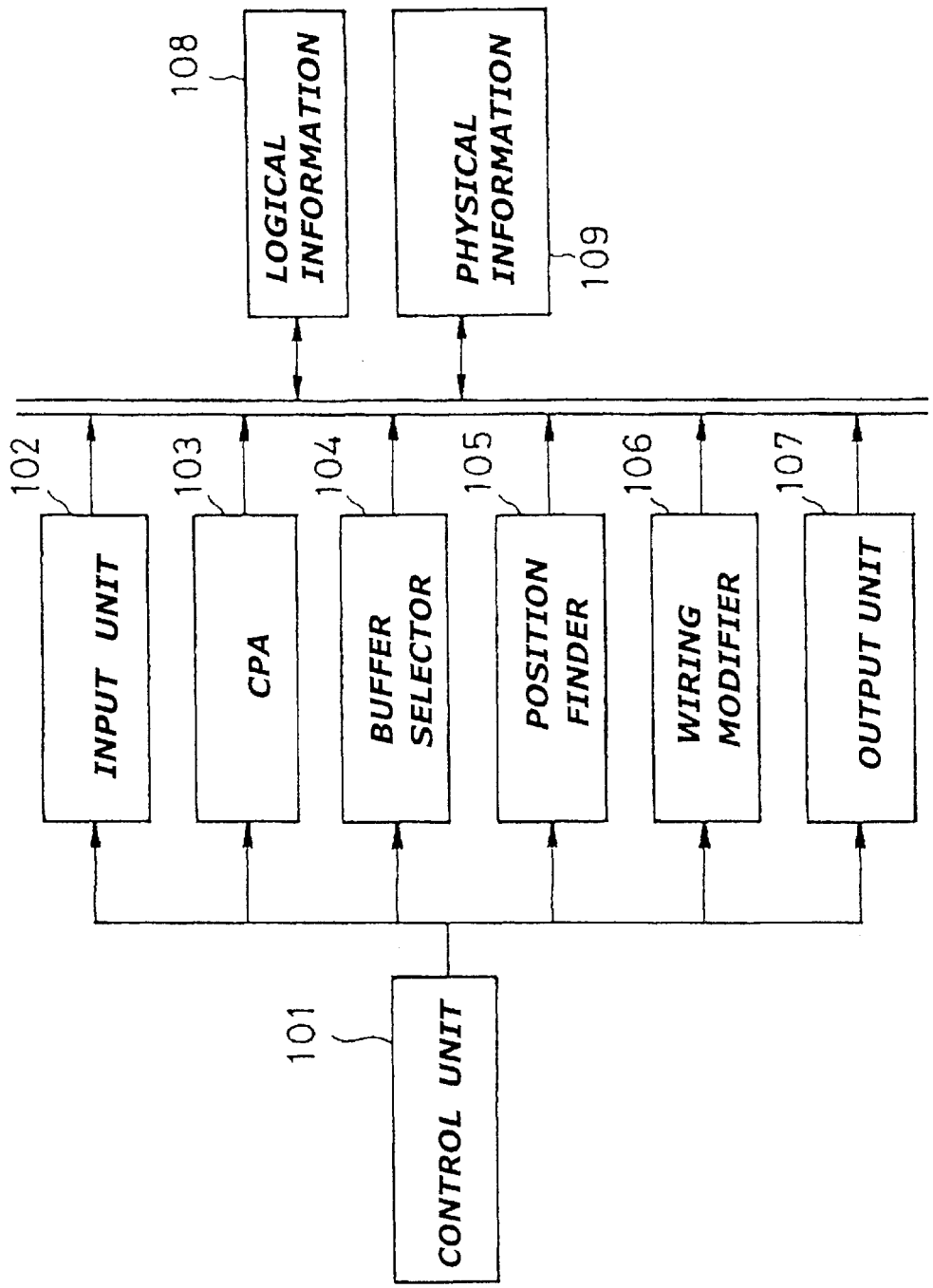

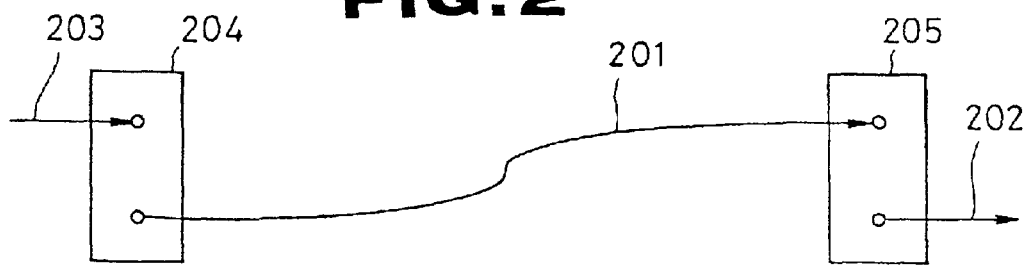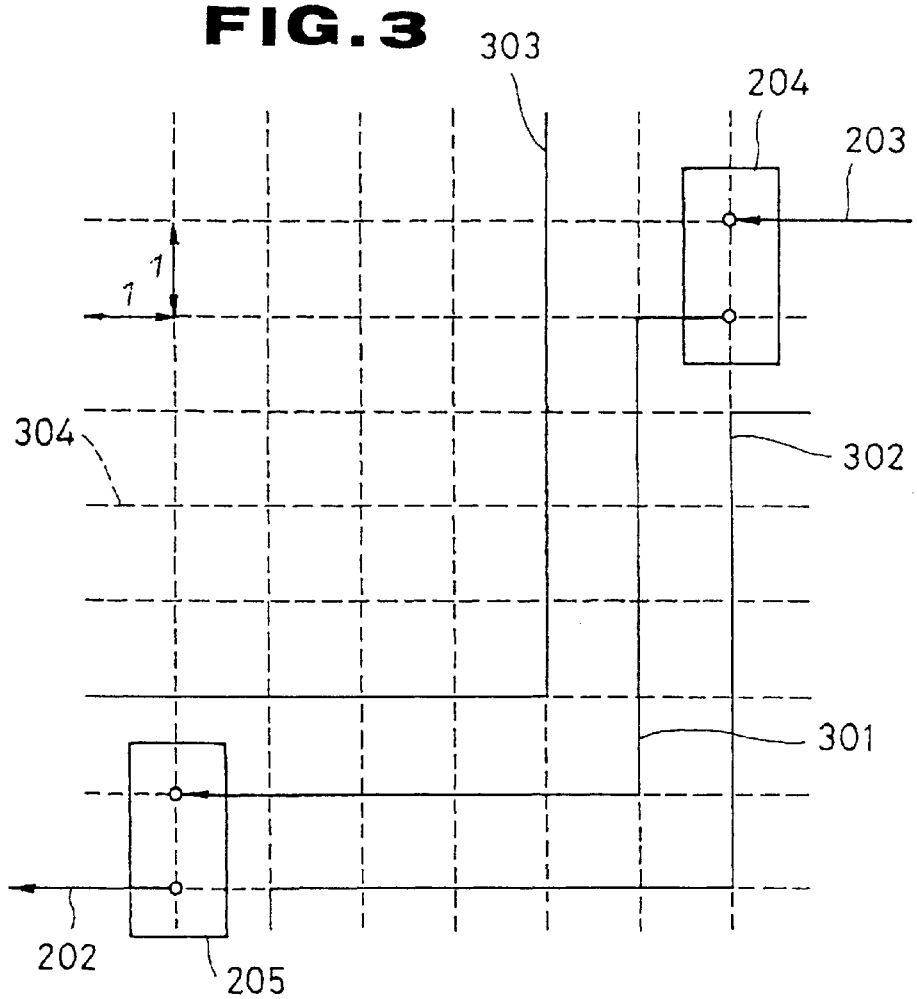

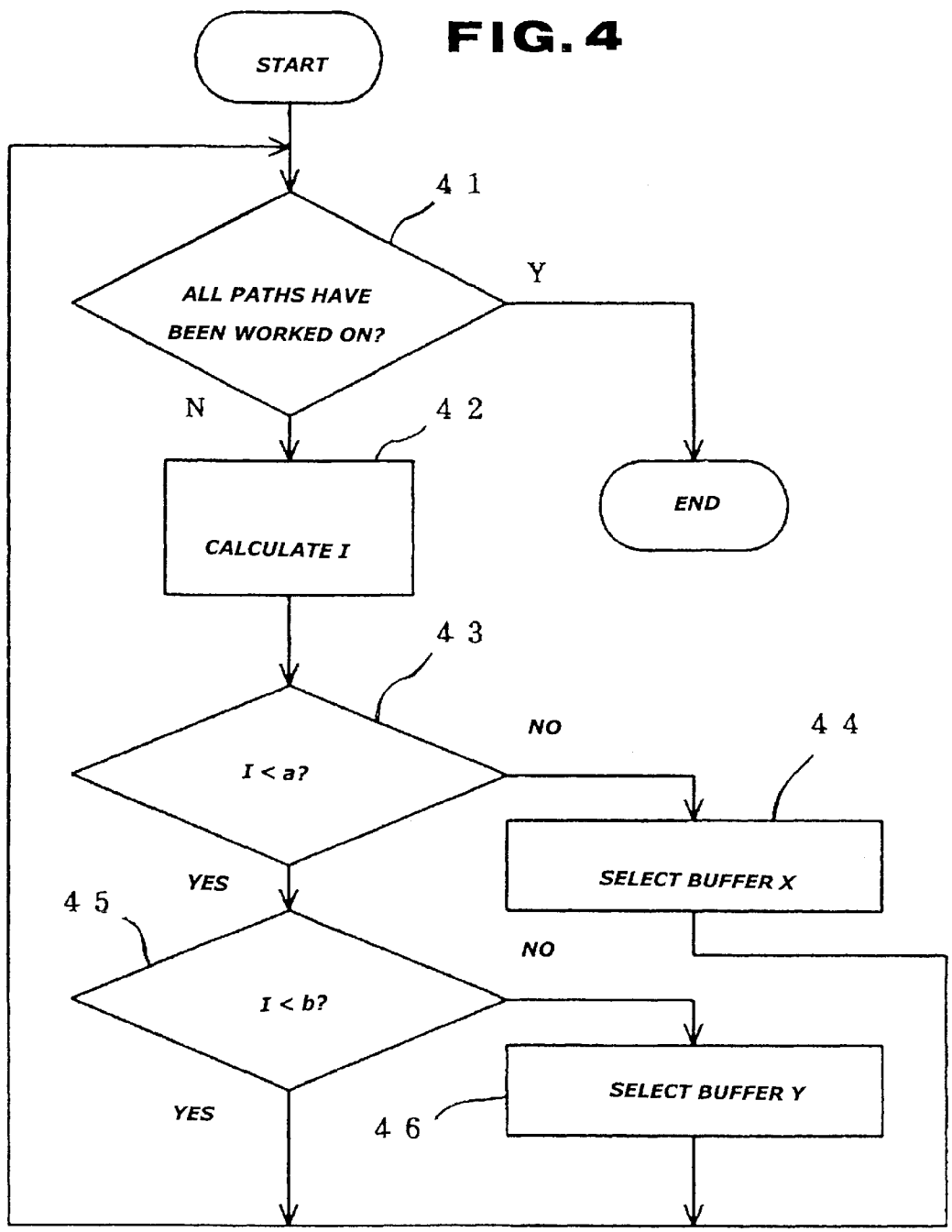

SYSTEM FOR AVOIDING ELECTROMIGRATION IN LSI CIRCUITS

FIELD OF THE INVENTION

The present invention relates to a system for avoiding electromigration in circuits, such as, LSI circuits.

BACKGROUND OF THE INVENTION

In general, computer aided design (CAD) is used for the circuit design of LSI. Application of CAD to the circuit design of LSI is discussed on pages 31 to 62 of a publication entitled "CAD FOR LOGIC DEVICES" issued Mar. 20, 1980 by Information Processing Society in Japan.

The trend in LSI technology has resulted in narrower interconnection lines and smaller contacts. This has aggravated the electromigration-induced failure problem.

Potential electromigration-induced failure exists in the conductors with narrow effective cross-sectional areas at portions which allow the passage of large current. Examples of such portions are conductor lines and contacts in circuit elements, power supply conductor lines, and signal conductor lines. In the description, "circuit element" is herein defined and used as a general term of all elements of logic circuits, such as flip-flops, gates, etc.

It is the conventional practice to manually correct potential electromigration-induced failures by modifying a wiring pattern after the layout of circuit elements or by elaborating circuit design to shorten a conductor line or via.

JP-A- 4-242959 discloses a semiconductor device that has regions reserved for possible expansion of width of each power supply line or via. Thus, without any substantial modification of the layout, the width of each power supply line or via can be increased in response to the result of a calculation of current density between a power source and ground.

JP-A 2-188943 discloses a system for laying power supply lines of LSI circuits. This system sets paths or routes along which power supply lines are laid after determining appropriate positions of circuit elements in accordance with a designed layout. Subsequently, the system determines the time average electric power consumed by each of regions separated by the power supply line routes. Based on the determined values of electric power, the system determines the effective time average values of electric current for the regions, respectively. Using the determined effective time average values of electric current and power supply resistance conductors connecting the regions to a power supply pad, the system determines electric current values of the power supply lines, respectively. In accordance with these results, the system determines the appropriate width of each of the power supply lines.

JP-A 4-365350 discloses a system for avoiding electromigration in power supply lines. The system inputs information as to electric power consumed by each of logic elements. Then, it determines an appropriate combination of logic elements within each range to which one of the power supply lines can supply electricity. In the process, the system selects one of the logic elements and evaluates whether the selected one element can be a new constituent of the combination. For evaluation of the selected logic element, the sum of values of the electric power consumed by the selected logic element and the current elements of the combination is compared with an upper limit of electric power that is allowed to be supplied to the range. The selected logic element becomes a new element of the combination when the sum of electric power is less than the upper limit. However, the selected logic element is not allowed to become the new element of the combination when the sum of electric power is not less than the upper limit. In this manner, the electric current density of each power supply line is limited, so that the width of each power supply line is left unaltered.

P. Yang et al., "Design for Reliability: The Major Challenge for VLSI," Proceedings of the IEEE, vol. 81, No. 5, May 1993, pp. 730–744 discuss selected reliability issues within the context of the design-in reliability concept. In this paper, electromigration models and current density estimation issues are discussed (see pp. 731–732).

An object of the present invention is to provide a system that can automatically avoid potential electromigration-induced failure problem during design of LSI circuits.

SUMMARY OF THE INVENTION

According to one aspect of the present invention, there is provided a system for avoiding electromigration-induced failure problem in an integrated circuit, which system is operative to determine electric current density of electric current that would pass through a conductor line lying along a first path, and to determine a position of a buffer for insertion into said first path when said determined electric current density is not less than a predetermined reference value.

According to another aspect of the present invention there is provided a method of avoiding electromigration-induced failure problem in an integrated circuit, comprising the steps of:
  determining electric current density of electric current that would pass through a conductor line lying along a first path;
  comparing said determined electric current density with a predetermined reference value; and
  determining a position of a buffer for insertion into said first path in response to said comparing result.

According to still another aspect of the present invention, there is provided a system for avoiding electromigration-induced failure problem in an integrated circuit, which system is operative to find potential electromigration-induced failure problem along a conductor line lying along a first path, and to determine a position of a buffer for insertion into said first path upon finding the potential electromigration induced failure problem.

BRIEF DESCRIPTION OF THE DRAWINGS

FIG. 1 is a block diagram of a first embodiment of a system according to the present invention;

FIG. 2 is a schematic view illustrating, as an example, a logical interconnection of circuit elements;

FIG. 3 is a wiring diagram illustrating the result from installing the logical interconnection of FIG. 2 in a conventional manner;

FIG. 4 is a flow chart of a buffer selecting routine;

DETAILED DESCRIPTION OF THE EMBODIMENTS

Figure 5:
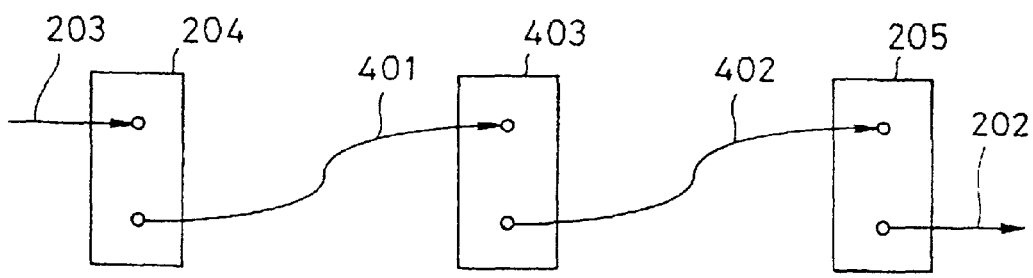
FIG. 5 is a schematic view illustrating a modified version resulting from inserting a relay buffer into the logical interconnection of circuit elements shown in FIG. 2.

FIG. 1 shows a first embodiment of a system according to the present invention. The system inputs and outputs a logical connection information 108 and a physical information 109. The physical information 109 includes θ position information as to where circuit elements are to be disposed or arranged. It also includes a conductor path or route information as to each path along which a conductor line or via lies to interconnect the circuit elements. It further includes predetermined reference values, each defining an upper limit of electric current density allowed to pass through a conductor line or via. These reference values are used for evaluating the paths for conductor lines.

Designated by the reference numeral 102 is an input unit for receiving logical information 108 and physical information 109. Designated by the reference numeral 103 is a conductor-path analyzer (CPA) that may contain a read only memory that stores computer software for calculation, comparison and evaluation. The CPA 103 calculates electric current density of electric current passing through a conductor line lying along a path and evaluates the path based on the result of comparing the electric current density with one of the predetermined reference value provided for evaluating the path. The CPA 103 evaluates each or at least one selected group of all paths that include initially available versions in an integrated circuit and modified versions. Based on the result of evaluation, the CPA 103 determines which one or ones of the conductor line paths involve electromigration-induced failure problem.

For each of the conductor line paths of the circuit that have been determined as involving electromigration-induced failure problem, a buffer selector 104 selects at least one buffer, which is capable of lowering the current density of the conductor line. The buffer selector 104 may contain a read only memory that stores computer software for selecting an appropriate buffer based on the determined electric current density. A position finder 105 determines the appropriate position of the selected buffer with respect to the path. The appropriate position may be in the path or in the neighborhood thereof. It is determined for expectation of considerable reduction of the electric current density. The position finder 105 may include a read only memory that stores computer software for determining the appropriate position of selected buffer.

The path in trouble is no longer used, thus requiring new paths to interconnect the determined position for selected buffer and the circuit elements. A wiring modifier 106 determines new or modified paths for conductor lines to interconnect the selected buffer at the determined position and the circuit elements that have been interconnected by the path in trouble. It also determines a new or modified path as a substitute of the path for a conductor line that will be involved in interference relation with the buffer at its determined position or its conductor lines. The adjacent conductor line may fail to act within the rules originally designed. One example of such failure is short-circuiting between the adjacent conductor lines. The wiring modifier 106 may include a read only memory that stores computer software for determining new or modified paths for conductor lines needed to install each of selected buffers in place of old path that will be separated by the buffer. The computer software may determine a new or modified path to replace a path that will be involved in interference relation with the selected buffer and its conductor lines lying along the new paths. Designated by the reference numeral 107 is an output unit. The output unit 107 issues the updated data resulting from the above-mentioned processes. A control unit 101 is responsible for the control of the processes conducted by the input unit 102, conductor-path analyzer (CPA) 103, buffer selector 104, position finder 105, wiring modifier 106 and output unit 107.

FIG. 2 illustrates a portion of the whole logical interconnections of circuit elements in the circuit. This portion, which is an example, includes two circuit elements 204 and 205 and conductor lines 201, 202 and 203. In the following description, this portion is used as a tool to explain how to conduct the arrangement and wiring. However, the same conduct is repeated for the rest of the whole logical interconnections of the circuit.

Referring to FIG. 3, let us now consider the result from implementing the logical interconnection shown in FIG. 2 according to the conventional layout technique. In FIG. 3, the reference numerals 302 and 303 designate paths of other conductor lines, respectively. Under this condition, the logical interconnection of FIG. 2 has been implemented. Reference numeral 301 designates the path for conductor line 201, which has been determined without any appropriate consideration of electric current density of the conductor line 201 and those of other conductor lines lying along the paths 302 and 303.

In general, electric current density can be calculated by dividing the measure of current passing through a conductor line by the cross sectional area thereof. Thus, reducing current passing through the conductor line can lower electric current density. Current I passing through the conductor line can be determined as a simple increasing function f of the line capacitance C as a variable and thus expressed as, $$I=f(C) \qquad \ldots (1).$$

Thus, reducing line capacitance of a conductor line results in reduction of electric current density without modification of cross sectional area of the conductor line.

One may approximate the equation giving current passing through a signal conductor line interconnecting circuit elements with the following equation, $$I=f_1(C)=\alpha \cdot C \qquad \ldots (2),$$

where: α is the product of circuit operating frequency and power source voltage.

Suppose each lattice in FIG. 3 measures one (1) by one (1) and line capacitance per unit length of one (1) is c. The length along the path 301 of the conductor line 201 is 11. Thus, current $I_{301}$ passing through the network 201 lying along the path 301 is given by the following equation:

$$I_{301}=11\alpha \cdot c \qquad \ldots (3).$$

If a conductor line branches off, electric current diverges at the branching point. In this case, the portion of the conductor line that extends from a circuit element where the conductor line originates to the branching point may become a bottleneck.

Suppose a predetermined reference value that defines an upper limit of electric current allowed to pass through the conductor line 201 lying along the path 301 is 10α=c. Electric current $I_{301}$ exceeds this predetermined reference value. Thus, the path 301 has an electromigration-induced failure problem.

Under the control of the current unit 101, the system according to the present invention operates as follows.

Referring to FIG. 1, the input unit 102 receives and controls input logical connection information 100 and physical information 109. As an example of physical information 109, the positional information of circuit elements and path information of conductor lines, which are derived from the conventional layout as shown in FIG. 3, is used in the following description.

For holding the layout data as illustrated in FIG. 3, various storing methods are available. For example, the position of each circuit element is stored in terms of a set of coordinate values. Its start, end, branching, and turning points that are stored in terms of sets of coordinate values respectively describe the path of each conductor line. Its width and height describe other property of each conductor line. They are classified as the physical information 109. The physical information 109 is composed of a position and path file and a library file.

The position and path file is composed of circuit element position information and conductor line path information. The position information has one descriptive part of the name of a circuit element and another descriptive part of its position. Assuming now that a block A is arranged at a point expressed by a set of coordinate values (100, 200) and a circuit element B is arranged at a point expressed by a set of coordinate values (300, 200), then the description becomes as follows.

INSTANCE A, (100, 200)
INSTANCE B, (300, 200)

The conductor line path information is composed of one descriptive part of the name of the path of a conductor line and another descriptive part of sets of coordinate values that express points through which the path of conductor line passes. Assume now that the path of a conductor line A passes through points expressed by sets of coordinate values (100, 200), (300, 200), (300, 400) and (800, 400), and the path of another conductor line B passes through points expressed by sets of coordinate values (500, 200) and (500, 400). Then, the description becomes as follows.

NETA, (100, 200), (300, 200), (300, 400), (800, 400)
NETB, (500, 200), (500, 400)

The library file contains information on other properties of each circuit element and each conductor line. It is composed of one descriptive part of the size of each circuit element and the position of its terminals, and another descriptive part of the width of each conductor line and the capacitance per one unit area of its conductor line. Let it be assumed that a circuit element F101 measures 500 microns by 600 microns and has terminals H01 and N01. Viewing the functional block F101 from its lower left corner, the terminal H01 lies at a position expressed by a set of coordinate values (50, 40) and the terminal N01 lies at a position expressed by a set of coordinate values (60, 100). The former is of a rectangle measuring 3 microns by 4 microns, and the latter is of a rectangle measuring 2 microns by 3 microns. Let is also be assumed that a circuit element F601 measures 300 microns by 200 microns and has terminals H02 and N02. Viewing the circuit element F601 from its lower left corner, the terminal H02 lies at a position expressed by a set of coordinate values (150, 40) and the terminal N02 lies at a position expressed by a set of coordinate values (30, 50). The former is of a rectangle measuring 3 microns by 2 microns and the latter is of a rectangle measuring 3 microns by 3 microns. These cases are described as follows.

OBJECT F101
SIZE 500 600
TERM H01 50 40 3 4
TERM N01 60 100 2 3
OBJECT F601
SIZE 300 200
TERM H02 150 40 3 2
TERM N02 30 50 3 3

Suppose that a conductor line used in wiring layer L1 measures 2 microns in width and has capacitance of 10 picofarad (pF) per unit area and a conductor line used in wiring layer L2 measures 3 microns in width and has capacitance of 15 pF per unit area. In this case, the description is as follows.

NET L1
WIDTH 2
CAPACITANCE 10
NET L2
WIDTH 3
CAPACITANCE 12

Predetermined reference values, which are stored as the physical information 109, are values differing depending on kinds of conductor lines, each resulting from calculation based on material of a conductor line and width thereof. In this embodiment, a value of 10α·c is input as the upper limit of electric current passing through conductor line 201 lying along the path 301.

The logical interconnection information 108 has data format as follows.

INSTANCE NAME OF CKT ELEMENT FUNCTION
NAME OF TERMINAL NAME OF PATH
NAME OF TERMINAL NAME OF PATH
INSTANCE NAME OF CKT ELEMENT FUNCTION
NAME OF TERMINAL NAME OF PATH

Suppose now that a circuit element A is an inverter F101, which has a terminal N01 connected with a conductor line along a path B and a terminal H01 connected with a conductor line along a path C. A circuit element D is a flip flop (F/F) F601, which has a terminal N02 connected with a conductor line along a path E, a terminal H01 with the conductor line along the path C, and a terminal H02 with a conductor line lying along a path F. Then, the description is as follows.

INSTANCE A F101
N01, B
H01, C
INSTANCE D F601
N02, E
H01, C
H02, F

In FIG. 1, the CPA 103 determines, by calculation, electric current density of each of conductors within each circuit element and electric current density of each conductor line interconnecting circuit elements. As mentioned before in the example shown in FIG. 3, electric current passing through the conductor line 201 along the path 301 is 11α·c, which is not less than the predetermined reference value of 10α predetermined for the path 301. Thus, the CPA 103 determines that this path 301 has electromigration-induced failure problem.

The buffer selector 104 selects at least one buffer out of a predetermined set of different buffers in kind for insertion into the path 301 of the conductor line 201. The selection results from considering the length of path, the available area for buffer to place in, and the expected reduction of current density by the insertion of the selected buffer. After selecting an appropriate buffer for insertion as a relay buffer into the path 301 of the conductor line 201, the buffer selector 104 updates the logical information 108. There are various ways of selecting buffer gate in number and in kind. One way is to use one or a combination of evaluation standards listed below.

1. Determine, by use of calculation, the degree of improvement of reduction of electric current density due to the kind and the number of buffer, and its expected inserting position.
2. Prepare and use a table containing rules that prescribe the kind and number of buffer and its inserting position versus electric current values of a conductor line.
3. Prepare and use a table containing rules that prescribe the kind and number of relay buffer and its inserting position versus lengths of a conductor line.
4. Minimize the number and size of buffer.

The way of selecting the buffer is explained in connection with FIG. 4. FIG. 4 is a flow chart illustrating a control routine implementing the way of selecting appropriate buffer performed by the buffer selector 104. Thus, the read only memory of the buffer selector 104 stores programs for the control routine. The buffer selector 104 may have a central processor unit (CPU) for executing the control routine although a central processor unit (CPU) of the control unit 101 can execute this control routine.

In step 41 of FIG. 4, the CPU determines whether or not all of the paths have been worked on. This step 41 is provided for the CPU to keep executing the control routine unit all of the paths have been worked on. In the next step 42, the CUP calculates electric current density (I) of a path. The routine proceeds from step 42 to step 43. In step 43, the CPU determines whether or not the calculated electric current density (I) is less than a first predetermined reference value (a). If this is not the case, the CPU selects, in step 44, a buffer X. If this is the case, the routine goes to step 45. In step 45, the CPU determines whether or not the calculated electric current density (I) is less than a second predetermined reference value (b). The second predetermined value (b) is less than the first predetermined value (a). If the calculated electric current density (I) is not less than the second predetermined value (b), the CPU selects, in step 46, a buffer Y. If the calculated electric current density (I) is less than the second predetermined value (b), the control routine returns to step 41. In this case, the CPU does not select any buffer. The control routine returns to step 41 after step 44 or step 46.

The predetermined values, with which the calculated electric current density is compared, correspond one-to-one to buffers, respectively. Each of the predetermined values is indicative of capability of driving the corresponding buffer. The buffer driving capability is proportional to the number of transistors, thus making it possible to select, as the predetermined value, an appropriate one value out of a set of predetermined different values versus different numbers of transistors.

If more than two different buffers in kind are prepared, calculated electric current density is compared with more than two predetermined values corresponding to more than two buffers.

In the flow chart of FIG. 4, it is assumed that, with a single buffer, a conductor path along the path having been worked on becomes free from electromigration-induced failure problem.

If electric current passing through a conductor line along the path is large, it may be considered that the conductor line is relatively long, causing a relatively long delay. In this case, in order to prevent the delay from increasing, it is necessary to use a high-power buffer with a low output terminal resistance.

If electric current passing through a conductor line along the path is small, it may be considered that the conductor line is relatively short, making it unnecessary to use a high-power gate. In this case, a small sized buffer gate should be used for ease of installation.

Figure 6:
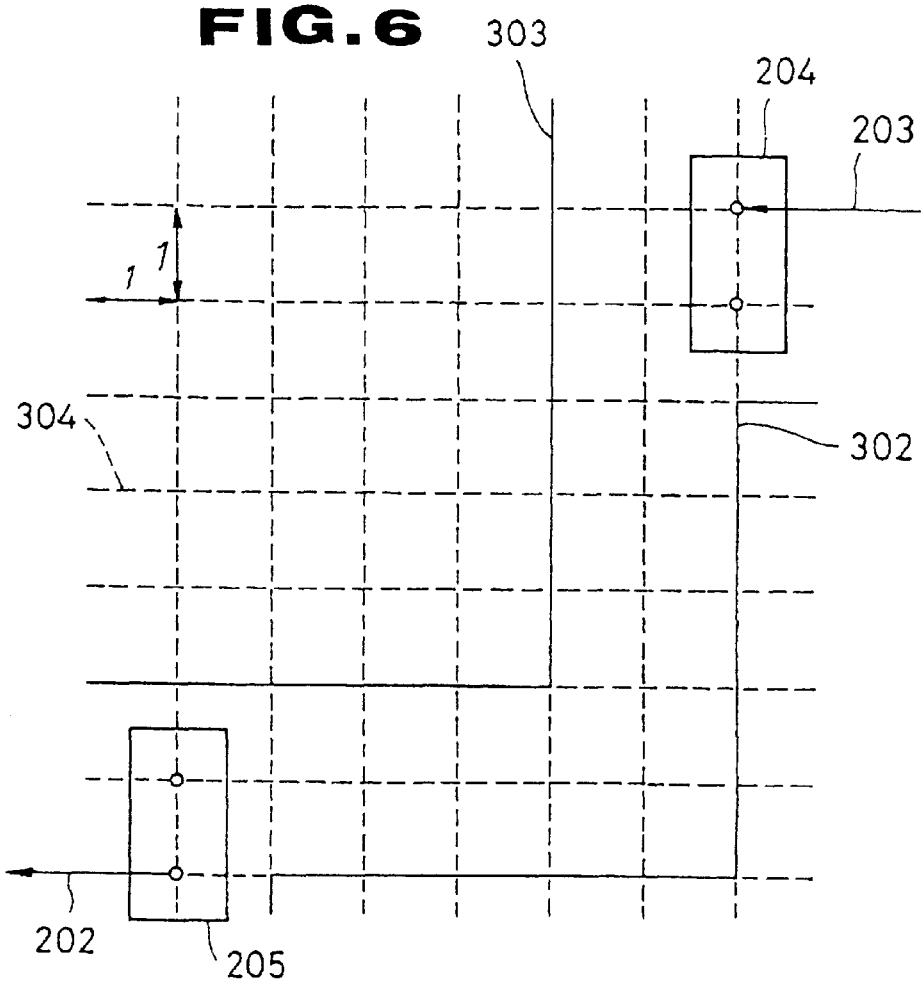
FIG. 6 is a wiring diagram resulting from deleting the information as to the path along which a conductor line lies to interconnect the circuit elements in FIG. 3.

The buffer selector 104 selects the appropriate buffer using the before-mentioned evaluation standards for disposition between circuit elements 204 and 205 as shown at a block 403 in FIG. 5. Concurrently, it updates the logical information 108 with this new information, and modifies the physical information 109, too. Since insertion of the buffer 403 divides the conductor line 201 into two conductor lines 401 and 402, the buffer selector 104 deletes the path 301 of the conductor line 201 from the logical information 108 to provide wiring diagram as illustrated in FIG. 6. However, the path information of the path 301 is preserved as the physical information 109.

Figure 7:
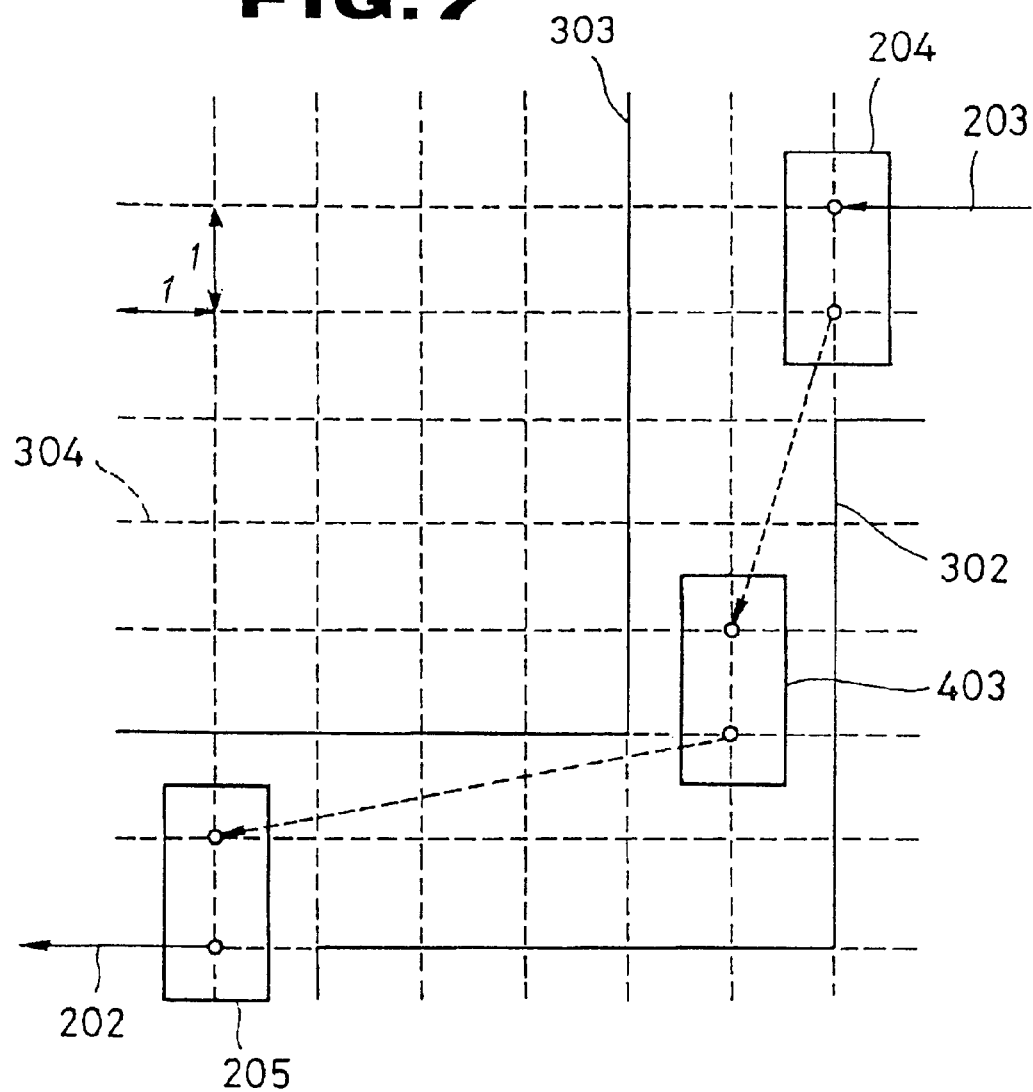
FIG. 7 is a wiring diagram resulting from placing a selected offer at an appropriate position in FIG. 6.

The position finder 105 determines the appropriate position of the selected buffer 403 within a positional area adjacent the path 301 (see FIG. 3) that is maintained as the path information in the physical information 109. The determined position for the buffer 403 is illustrated in FIG. 7. In FIG. 7, the determined position of the buffer 403 is on the path 301 and spaced almost equally along the path 301 from the circuit elements 204 and 205. This position is determined so that two conductor lines 401 and 402 (see FIG. 5) share electric current passing through the network 201 almost equally. In other words, electric current through the conductor line 201 along the path 301 is shared almost equally and thus it is generally equal to the sum of a share of electric current passing through the conductor line 401 and the remaining share passing through the other conductor line 402. In FIG. 7, there is no conductor line path within an area defined by the determined position of the buffer 403. However, if the paths of other conductor lines exist within that area, the position finder 105 deletes the path or paths of them that may violate rules set by the design to induce, for example, accidental short circuit.

Figure 8:
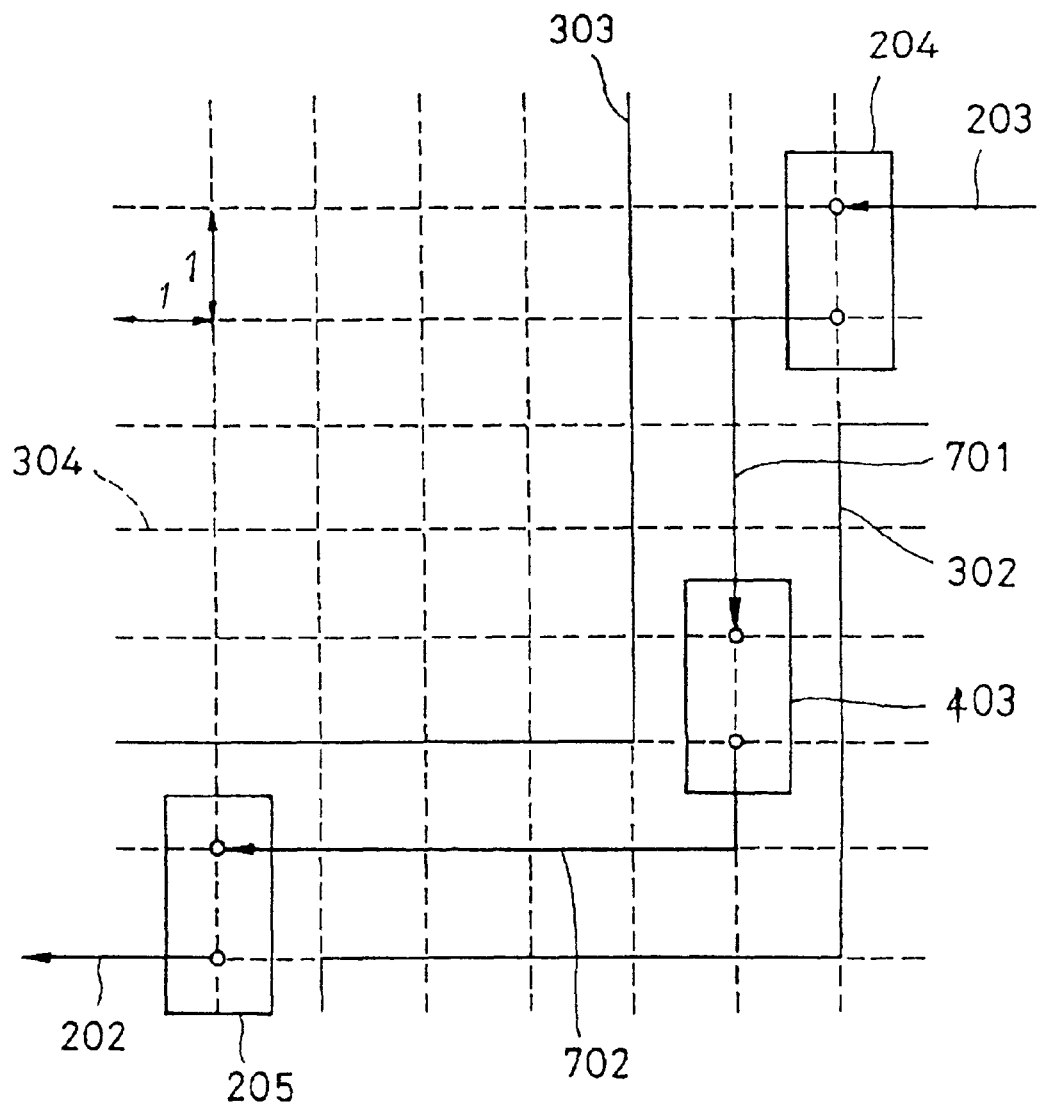
FIG. 8 is a wiring diagram illustrating paths for conductor lines to lie along in interconnecting the circuit elements and the buffer in FIG. 7.

Subsequently, the wiring modifier 106 determines new paths 701 and 702, as shown in FIG. 8, along which the conductor lines 401 and 402 are to lie respectively, to interconnect the determined position of the buffer 403, and the circuit elements 204 and 205. In FIG. 8, since the lengths of the paths 701 and 702 are 4 and 6, respectively, electric current $I_{701}$ and $I_{702}$ passing through conductor lines along these paths 701 and 702 are expressed as:

$$I_{701} = 4\alpha \cdot c \qquad \ldots (4)$$

$$I_{702} = 6\alpha \cdot c \qquad \ldots (5)$$

Comparing these equations with the before-mentioned equation (3) reveals that $I_{701}$ is less than $I_{301}$ and $I_{702}$ is less than $I_{301}$, too. Thus, the electromigration-induced problem of the path 301 of the conductor line 201 has been eliminated. In the above-discussed result of wiring in FIG. 8, the buffer is arranged within an area determined originally without any need for alteration of the paths of other conductor lines.

Figure 9:
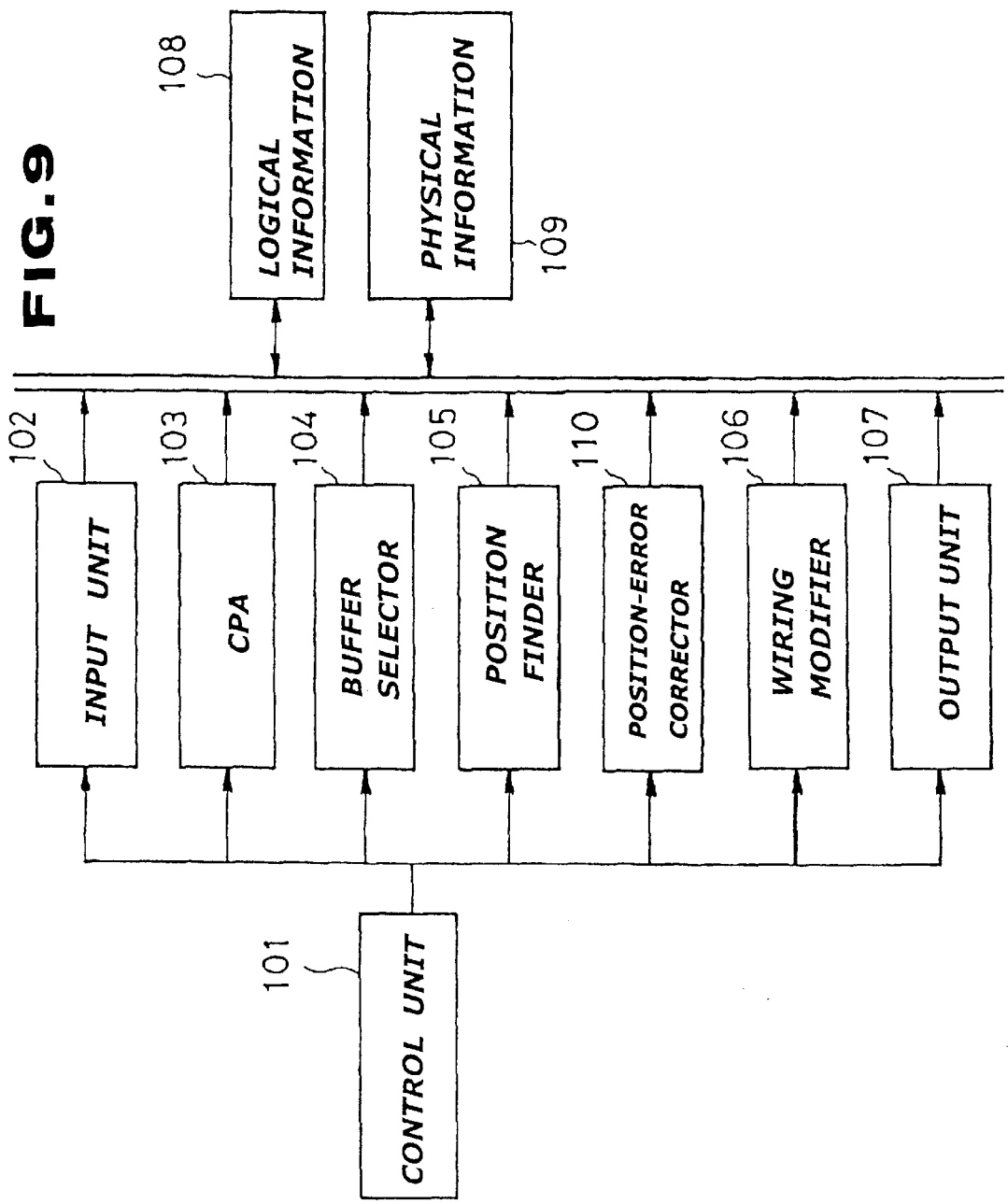
FIG. 9 is a similar view to FIG. 1 illustrating a second embodiment.

FIG. 9 is a block diagram of a second embodiment of a system for avoiding electromigration according to the present invention. The second embodiment is substantially the same as the first embodiment shown in FIG. 1 except the provision of a position-error corrector 110.

According to the system shown in FIG. 1, if a buffer is not allowed to lie at the position determined, the position finder 105 finds by searching another adjacent position as an alternate position for the buffer to be placed at.

According to the system shown in FIG. 9, a relay is placed at the position originally determined even if this results in position error with the position of other circuit elements. With the position of the buffer gate left as it is, the position-error corrector 110 repeats moving the position of the circuit elements overlying the position of buffer gate until the position error is eliminated. In the process, the position-error corrector 110 deletes the paths of conductor lines connected to the position of the block that has been moved and the path of such conductor line that has been caused by the movement of the position of the circuit element to violate the design rules. A wiring modifier 106 determines new paths to replace the previous paths that have been deleted.

In the first and second embodiments, the invention has been explained in connection with the potential electromigration-induced failure problem of interconnections among circuit elements. If connections within a circuit element have potential electromigration-induced failure problem, the present invention may be applied to the connections in the same manner to provide substantially the same result.

The position error is determined in a manner described below.

As mentioned before, physical information 109 contains the position where each circuit element is and dimensions of the circuit element, making it possible to calculate an area occupied by the circuit element. Using them, an area occupied by the circuit element that has been arranged is calculated. The position error is determined when the areas of the adjacent circuit element overlie one another.

When such a position error is determined, it is necessary to keep moving the position of circuit elements until the determined position error is eliminated. Suppose, for example, that the physical information 109 contains a set of coordinate values (100, 200) as a position where a circuit element is placed now. Moving the position of the circuit element to the right by 50 microns is expressed by a change of the x-coordinate value by 50 to give (150, 200). Thus, until the overlying problem of areas is solved, the coordinate values are subject to change in accordance with movement of the position of the circuit element up or down or to the left or to the right.

Figure 10:
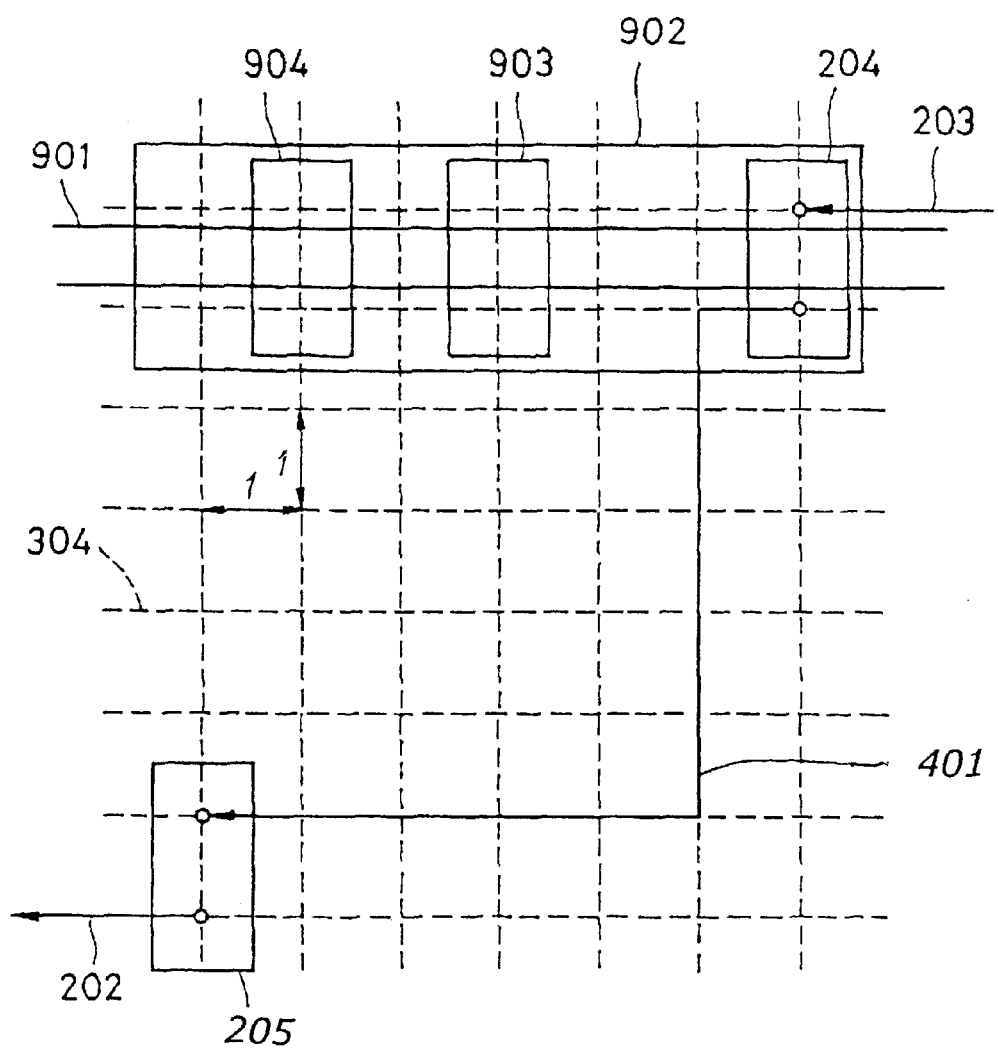
FIG. 10 is a wiring diagram illustrating one example of arrangement of power supply lines for circuit elements.

Next, let us consider electric current density through a power-supply line. The electric current density can be calculated in the same manner as explained before. Referring to FIG. 10, it is now assumed that a power-supply line 901 supplies electric current to circuit elements 204, 903 and 904. In FIG. 10, the reference numeral 902 designates a range which the power-supply line 901 can supply electric current.

Since the path 401, which interconnects circuit elements 204 and 205, is 11 long, electric current I passing through the conductor line along the path 401 can be expressed as.

$$I_{401} = 11\alpha \cdot c \qquad \ldots (6)$$

Thus, it is considered that the maximum current supplied by the power-supply line 901 to the circuit element 204 is equal to the value $11\alpha \cdot c$. Let us suppose that maximum values of electric current supplied by the power-supply line 901 to the circuit elements 903 and 904 are $10\alpha \cdot c$ and $15\alpha \cdot c$, respectively. The maximum value $I_{901}$ of electric current passing through the power-supply line 901 can be expressed as follows.

$$I_{901} = 11\alpha \cdot c + 10\alpha \cdot c + 15\alpha \cdot c = 36\alpha \cdot c \qquad \ldots (7)$$

If a predetermined reference value, defining an upper limit, imposed on the power-supply line 901 is $34\alpha \cdot c$, it is considered that the power-supply line 901 has a potential electromigration-induced failure problem.

This is where the present invention is implemented. A difference from the first embodiment is that a predetermined reference value corresponding to a power-supply line is used instead of the predetermined reference value or values for signal conductor lines.

Figure 11:
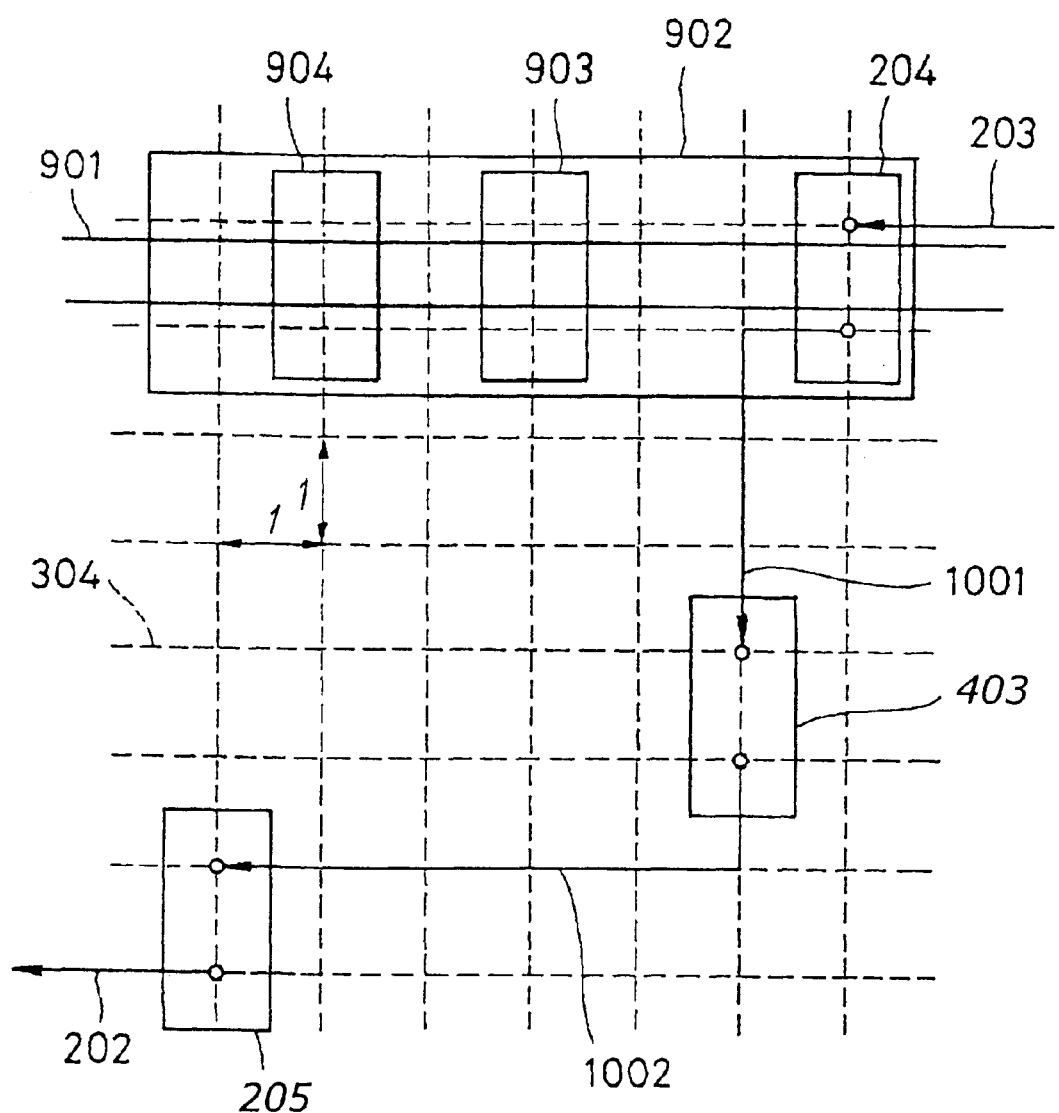
FIG. 11 is a wiring diagram in which a buffer is placed at such an appropriate position as to cause a reduction in electric current density of a power supply line.

FIG. 11 shows the wiring result in which, without requiring any detour, a buffer 403 is arranged at a position, within the path 401, initially determined. In FIG. 11, the buffer 403 is connected between the circuit elements 204 and 205 by two conductor lines lying along paths 1001 and 1002, respectively.

Electric current passing along the path 1001 is expressed as:

$$I_{1001} = 4\alpha \cdot c \qquad \ldots (8)$$

Thus, the maximum value of electric current passing through the power supply line 901 is expressed as:

$$I_{901} = 4\alpha \cdot c + 10\alpha \cdot c + 15\alpha \cdot c = 29\alpha \cdot c \ tm \ \ldots (9)$$

Thus, the power supply line 901 is now free from electromigration-induced failure problem.

For identification of signal conductor lines from power-supply lines, it is preferable to use indexes.

From the preceding description, it is now understood that if the path of a conductor line or via is found to have or cause a potential electromigration-induced failure problem, a buffer is disposed in a manner to divide the path of the conductor line into two paths. This causes a reduction in line capacity of each of newly installed conductor lines along the divided paths. The reduction in capacity causes a drop of electric current density passing through the line. In this manner, the wiring result free from electromigration-induced failure problem is given.

It is also understood that alteration to solve the electromigration-induced failure problem is conducted automatically.

According to the embodiments, the layout result is used in selection the number and kind of relay buffers for insertion into the layout. As a result, with the minimum number of required buffers, potential electromigration-induced failure problem can be eliminated. This has proved to be advantageous in suppressing an increase of power consumption owing to the addition of such buffers.

According to the embodiments, alteration of the initial layout result is conduced in an incremental manner under the control of the wiring modifier 106. This has shortened the time required for the alteration. Besides, this has proved to be advantageous in reducing electric current density with excellent accuracy, resulting in prolongation of service life of LSI circuits.

What is claimed is:

1. A system for avoiding electromigration-induced failure problem in an integrated circuit, which system is operative to determine electric current density of an electric current that would pass through a conductor line lying along a first path, and to determine a position of a buffer for insertion into said first path when said determined electric current density is not less than a predetermined reference value.

2. The system is claimed in claim 1, which system is operative to alter a second path along which another conductor line lies when said second path interferes with said determined position of said buffer.

3. The system as claimed in claim 1, which system is operative to move at least one of said determined position of said buffer and a position of a circuit element that interferes with said determined position of said buffer.

4. The system as claimed in claim 1, wherein said determined electric current density results from a calculation based on electric current and capacitance of said conductor line lying along said first path.

5. The system as claimed in claim 1, which system selects, in response to said determined electric current density, at least one buffer out of a set of predetermined buffers as said buffer to be inserted.

6. A method of avoiding electromigration-induced failure problem in an integrated circuit, comprising the steps of:
 determining electric current density of electric current that would pass through a conductor line lying along a first path;
 comparing said determined electric current density with a predetermined reference value; and
 determining a position of a buffer for insertion into said first path in response to said comparing result.

7. A method as claimed in claim 6, wherein said determined electric current density results from a calculation based on electric current and capacitance of said conductor line lying along said first path.

8. A method as claimed in claim 6, wherein at least one buffer is selected, in response to said determined electric density, out of a set of predetermined buffers as said buffer to be inserted.

9. A system for avoiding electromigration-induced failure problem in an integrated circuit, which system is operative to find potential electromigration-induced failure problem along a conductor line lying along a first path, and to determine a position of a buffer for insertion into said first path upon finding the potential electromigration induced failure problem.

10. A method of avoiding electromigration-induced failure problem in an integrated circuit, comprising the steps of:
 determining electric current density of electric current that would pass through a conductor line lying along a first path;
 comparing said determined electric current density with a predetermined value;
 determining a position of a buffer for insertion into said first path in response to said comparing result; and
 altering a second path along which another conductor line lies when said second path interferes with said determined position of said buffer.

11. A method of avoiding electromigration-induced failure problem in an integrated circuit, comprising the steps of:
 determining electric current density of electric current that would pass through a conductor line lying along a first path;
 comparing said determined electric current density with a predetermined value;
 determining a position of a buffer for insertion into said first path in response to said comparing result; and
 moving one of said determined position of said buffer and a position of a circuit element when said position of said block interferes with said determined position of said buffer.

12. An apparatus for avoiding electromigration-induced failure problem during circuit design of a large scale integrated (LSI) circuit, the apparatus comprising:
 a conductor-path analyzer (CPA) to calculate an electric current density of electric current that would pass through a conductor line lying along a path, to evaluate the path based on the result of comparing the calculated electric current density with a predetermined reference value provided for evaluating the path, to determine whether or not the path involves electromigration-induced failure problem;
 a buffer selector to select a buffer, said buffer lowering current density of the conductor line lying along the path, based on the calculated electric current density if said CPA has determined that the path involved electromigration-induced failure problem;
 a position finder to determine a position of the selected buffer with respect to the path;
 a wiring modifier to determine new paths for conductor lines to interconnect the selected buffer at the determined position and circuit elements that have been interconnected by the path that has been determined as involving said electromigration-induced failure problem, and to determine a new path as a substitute of a path for a conductor line that will interfere with the selected buffer at the determined position, the conductor lines to interconnect the selected buffer and the circuit elements.

13. The apparatus as claimed in claim 12, further comprising a position-error corrector to move a circuit elements overlying the determined position of the selected buffer.

14. A method for avoiding electromigration-induced failure problem during circuit design of a large scale integrated (LSI) circuit, the method comprising the steps of:
 calculating an electric current density of electric current density of electric current that would pass through a conductor line lying along a path, to evaluate the path based on the result of comparing the calculated electric current density with a predetermined reference value provided for evaluating the path, to determine whether or not the path involves electromigration-induced failure problem;
 selecting a buffer, said buffer lowering current density of the conductor line lying along the path, based on the calculated electric current density if the path involves electromigration-induced failure problem;
 determining a position of the selected buffer with respect to the path;
 determining new paths for conductor lines to interconnect the selected buffer at the determined position and circuit elements that have been interconnected by the path that has been determined as involving said electromigration-induced failure problem, and to determine a new path as a substitute of a path for a conductor line that will interfere with the selected buffer at the determined position, the conductor lines to interconnect the selected buffer and the circuit elements.

15. The method as claimed in claim 14, further comprising moving circuit elements overlying the determined position of the selected buffer.

* * * * *